(12) United States Patent
Lee et al.

(10) Patent No.: US 10,867,651 B2
(45) Date of Patent: *Dec. 15, 2020

(54) INITIALIZATION PROCESS FOR MAGNETIC RANDOM ACCESS MEMORY (MRAM) PRODUCTION

(71) Applicant: Taiwan Semiconductor Manufacturing Company, Ltd., Hsinchu (TW)

(72) Inventors: Yuan-Jen Lee, Freemont, CA (US); Guenole Jan, San Jose, CA (US); Huanlong Liu, Sunnyvale, CA (US); Jian Zhu, San Jose, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/442,737

(22) Filed: Jun. 17, 2019

(65) Prior Publication Data

US 2019/0311754 A1 Oct. 10, 2019

Related U.S. Application Data

(63) Continuation of application No. 15/818,148, filed on Nov. 20, 2017, now Pat. No. 10,325,639.

(51) Int. Cl.
*G11C 11/00* (2006.01)
*G11C 11/16* (2006.01)
(Continued)

(52) U.S. Cl.
CPC .......... *G11C 11/165* (2013.01); *G11C 11/161* (2013.01); *G11C 11/1675* (2013.01);
(Continued)

(58) Field of Classification Search
CPC .................................................... G11C 11/161
(Continued)

(56) References Cited

U.S. PATENT DOCUMENTS 6,166,948 A  12/2000 Parkin et al.
6,395,621 B1  5/2002 Mizushima et al.
(Continued)

FOREIGN PATENT DOCUMENTS

JP  WO2009101827  6/2011
WO  WO20091010827  8/2009

OTHER PUBLICATIONS

Zhu, Jian-Gang et al., "Microwave Assisted Magnetic Recording," IEEE Transactions on Magnetics, vol. 44, No. 1, Jan. 2008, pp. 125-131.
(Continued)

*Primary Examiner* — Hoai V Ho
(74) *Attorney, Agent, or Firm* — Haynes and Boone, LLP

(57) ABSTRACT

An initialization process is disclosed for a perpendicular magnetic tunnel junction (p-MTJ) wherein the switching error rate is reduced from a typical range of 30-100 ppm to less than 10 ppm. In one embodiment, an in-plane magnetic field is applied after a final anneal step is performed during memory device fabrication such that all magnetizations in the free layer, and AP1 and AP2 pinned layers are temporarily aligned "in-plane". After the applied field is removed, interfacial perpendicular magnetic anisotropy (PMA) at a tunnel barrier/AP1 interface induces a single AP1 magnetic domain with a magnetization in a first vertical direction. Interfacial PMA at a FL/tunnel barrier interface affords a single FL domain with magnetization in the first direction or opposite thereto. AP2 magnetization is opposite to the first direction as a result of antiferromagnetic coupling with the AP1 layer. Alternatively, a perpendicular-to-plane magnetic field may be applied for initialization.

20 Claims, 6 Drawing Sheets

(51) Int. Cl.
*H01L 27/22* (2006.01)
*H01L 43/02* (2006.01)
*H01L 43/08* (2006.01)
*H01L 43/12* (2006.01)
*H01L 43/10* (2006.01)

(52) U.S. Cl.
CPC ............ *H01L 27/222* (2013.01); *H01L 43/02* (2013.01); *H01L 43/08* (2013.01); *H01L 43/12* (2013.01); *H01L 43/10* (2013.01)

(58) Field of Classification Search
USPC .......................................................... 365/158
See application file for complete search history.

(56) References Cited

U.S. PATENT DOCUMENTS

| | | | |
|---|---|---|---|
| 6,593,608 B1 | 7/2003 | Sharma et al. | |
| 6,743,503 B1 | 6/2004 | Chen | |
| 6,806,096 B1 | 10/2004 | Kim et al. | |
| 6,834,005 B1 | 12/2004 | Parkin | |
| 6,847,510 B2 | 1/2005 | Childress et al. | |
| 6,974,708 B2 | 12/2005 | Horng et al. | |
| 6,977,801 B2 | 12/2005 | Carey et al. | |
| 6,984,529 B2 | 1/2006 | Stojakavic et al. | |
| 7,001,783 B2 | 2/2006 | Costrini et al. | |
| 7,027,268 B1 | 4/2006 | Zhu et al. | |
| 7,060,194 B2 | 6/2006 | Kodaira et al. | |
| 7,166,173 B2 | 1/2007 | Beach | |
| 7,169,654 B2 | 1/2007 | Zia et al. | |
| 7,241,631 B2 | 7/2007 | Huai et al. | |
| 7,335,961 B2 | 2/2008 | Guo et al. | |
| 7,449,345 B2 | 11/2008 | Horng et al. | |
| 7,471,445 B2 | 12/2008 | Pan | |
| 7,593,193 B2 | 9/2009 | Inomata et al. | |
| 7,596,015 B2 | 9/2009 | Kitagawa et al. | |
| 7,696,551 B2 | 4/2010 | Xiao et al. | |
| 7,742,263 B2 | 6/2010 | Fukumoto et al. | |
| 7,978,442 B2 | 7/2011 | Zhang et al. | |
| 8,159,866 B2 | 4/2012 | Apalkov et al. | |
| 8,174,873 B2 | 5/2012 | Suzuki et al. | |
| 8,203,389 B1 | 6/2012 | Zhou et al. | |
| 8,233,249 B2 | 7/2012 | Worledge | |
| 8,269,292 B2 | 9/2012 | Horng et al. | |
| 8,270,112 B2 | 9/2012 | Funayama et al. | |
| 8,450,119 B2 | 5/2013 | Torng et al. | |
| 8,456,884 B2 | 6/2013 | Apalkov et al. | |
| 8,462,461 B2 | 6/2013 | Braganca et al. | |
| 8,582,240 B1 | 11/2013 | Chen et al. | |
| 8,604,886 B2 | 12/2013 | Nikonov et al. | |
| 8,634,163 B2 | 1/2014 | Tanabe et al. | |
| 8,716,072 B2 | 5/2014 | Bangsaruntip et al. | |
| 8,722,543 B2 | 5/2014 | Belen et al. | |
| 8,785,966 B2 | 7/2014 | Worledge et al. | |
| 8,921,961 B2 | 12/2014 | Kula et al. | |
| 8,971,100 B2 | 3/2015 | Zhou et al. | |
| 8,981,505 B2 | 3/2015 | Moriyama et al. | |
| 8,981,507 B2 | 3/2015 | Takahashi et al. | |
| 9,006,704 B2 | 4/2015 | Jan et al. | |
| 9,166,154 B2 | 10/2015 | Satoh et al. | |
| 9,230,571 B1 | 1/2016 | Chen et al. | |
| 9,269,894 B2 | 2/2016 | Mudivarthi et al. | |
| 9,275,713 B2 | 3/2016 | Guo | |
| 9,362,490 B1 | 6/2016 | Xiao | |
| 9,373,781 B2 | 6/2016 | Tang et al. | |
| 9,553,258 B2 | 1/2017 | Whig et al. | |
| 9,590,010 B1 | 3/2017 | Gattwald et al. | |
| 9,614,258 B2 | 4/2017 | Takahashi et al. | |
| 10,325,639 B2 * | 6/2019 | Lee ........................ H01L 43/08 | |
| 2003/0073251 A1 | 4/2003 | Ning | |
| 2005/0277207 A1 | 12/2005 | Costrini et al. | |
| 2007/0097730 A1 * | 5/2007 | Chen .................... G11C 11/1673 365/158 |
| 2007/0215911 A1 | 9/2007 | Torng et al. | |
| 2009/0078927 A1 | 3/2009 | Xiao et al. | |
| 2009/0159563 A1 | 6/2009 | Jung | |
| 2009/0261437 A1 | 10/2009 | Kang et al. | |
| 2010/0072524 A1 | 3/2010 | Huai et al. | |
| 2011/0084347 A1 | 4/2011 | Shin et al. | |
| 2011/0090732 A1 * | 4/2011 | Li ........................... H01L 43/08 365/158 |
| 2012/0012953 A1 | 1/2012 | Lottis et al. | |
| 2012/0023386 A1 | 1/2012 | Oh et al. | |
| 2012/0058575 A1 | 3/2012 | Horng et al. | |
| 2012/0155156 A1 | 6/2012 | Watt et al. | |
| 2012/0205758 A1 | 8/2012 | Jan et al. | |
| 2012/0292723 A1 | 11/2012 | Luo et al. | |
| 2012/0299135 A1 | 11/2012 | Zheng et al. | |
| 2013/0230741 A1 | 9/2013 | Wang et al. | |
| 2014/0217528 A1 | 8/2014 | Whig et al. | |
| 2014/0235056 A1 | 8/2014 | Guha et al. | |
| 2015/0260804 A1 | 9/2015 | Kishi et al. | |
| 2016/0315249 A1 | 10/2016 | Kardasz et al. | |
| 2016/0351798 A1 | 12/2016 | Shen et al. | |
| 2017/0084836 A1 | 3/2017 | Kim et al. | |
| 2017/0098762 A1 | 4/2017 | Worledge | |
| 2017/0125663 A1 | 5/2017 | Nagel et al. | |
| 2019/0156876 A1 | 5/2019 | Lee et al. | |

OTHER PUBLICATIONS

Kubota, Hitoshi et al., "Spin-Torque Oscillator Based on Magnetic Tunnel Junction with a Perpendicularly Magnetized Free Layer and In-Plane Magnetized Polarizer," 2013 The Japan Society of Applied Physics, Applied Physics Express 6 (2013) 103003, Sep. 27, 2013, pp. 1-3.

Zeng, Zhongming et al., "High-Power Coherent Microwave Emission from Magnetic Tunnel Junction Nano-oscillators with Perpendicular Anisotropy," 2012 American Chemical Society, vol. 6, No. 7, Jun. 4, 2012, pp. 6115-6121.

Klaua, M. et al., "Growth, structure, electronic, and magnetic properties of MgO/Fe(001) bilayers and Fe/MgO/Fe(001) trilayers," Physical Review B, 2001 the American Physical Society, vol. 64, 134411, 2001, pp. 1-8.

Ikeda, S. et al., "A perpendicular-anisotropy CoFeB—MgO magnetic tunnel junction," nature materials, Letters published online Jul. 11, 2010, DOI: 10.1038/NMAT2804, www.nature.com/naturematerials, pp. 104.

PCT Search Report, International Application No. PCT/US12/24613 dated Jun. 20, 2012, Applicant: Magic Technologies, Inc., 12 pages.

Slonczweski, J.C., "Current-driven excitation of magnetic multilayers," vol. 159, Issues 1-2, Jun. 1996, pp. L1-L7, Elsevier.

PCT Search Report, International Application No. PCT/US2014/010309 dated May 13, 2014, Applicant: Headway Technologies, Inc., 10 pages Huai, Yiming et al., "Spin transfer switching current reduction in magnetic tunnel junction based dual spin filter structures," Appl. Phys. Lett. 87, 222510 (2005); https://doi.org/10.1063/1.2138363, Published online Nov. 23, 2005, Accepted Oct. 2005, pp. 106.

Worledge, D.C., "Theory of Spin Torque Switching Current for the Double Magnetic Tunnel Junction," IEEE Magnetics Letters, DOI: 10.1109/LMAG.2017.2707331, vol. 8, May 23, 2017, pp. 106.

Diao, Zhitao et al., "Spin transfer switching in dual MgO magnetic tunnel junctions," Applied Physics Letters, 10.1063/1.2717556, vol. 90, Issue 13, Published online Mar. 28, 2007, Accepted Feb. 2007, 8 pages.

Hu, G. et al., "STT-MRAM with double magnetic tunnel junctions," 2015 IEEE International Electron Devices Meeting (IEDM), Dec. 7-9, 2015, pp. 1-4.

* cited by examiner

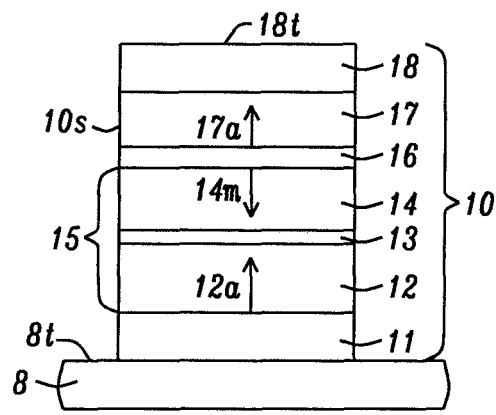 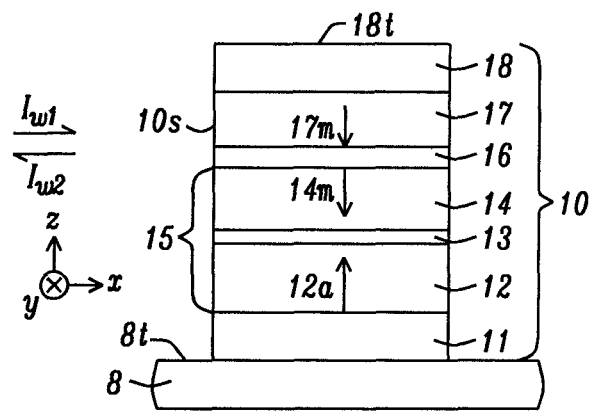
FIG. 1a        FIG. 1b
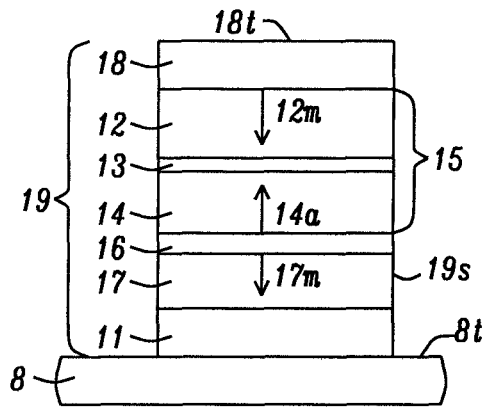 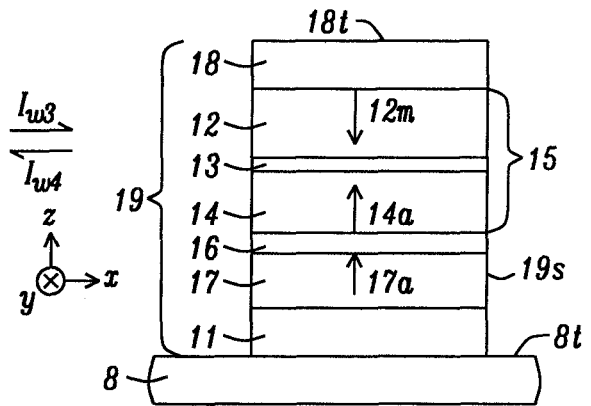
FIG. 2a        FIG. 2b

INITIALIZATION PROCESS FOR MAGNETIC RANDOM ACCESS MEMORY (MRAM) PRODUCTION

PRIORITY DATA

The present application is a continuation application of U.S. patent application Ser. No. 15/818,148 filed Nov. 20, 2017, which is hereby incorporated by reference in its entirety.

RELATED PATENT APPLICATIONS

This application is related to Ser. No. 15/668,113, filed on Aug. 3, 2017; and Ser. No. 16/056,791, filed Aug. 7, 2018; which are herein incorporated by reference in their entirety.

TECHNICAL FIELD

The present disclosure relates to a method of establishing a single domain in the pinned layer of a magnetic tunnel junction (MTJ) thereby providing a lower switching error rate of an adjacent free layer during a write process, and leading to lower power consumption with longer device lifetimes.

BACKGROUND

Perpendicularly magnetized magnetic tunnel junctions (p-MTJs) are a major emerging technology for use in embedded MRAM applications, in standalone MRAM applications, and in spin-torque transfer (STT)-MRAM. STT-MRAM is a p-MTJ technology using spin-torque for writing of memory bits that was described by C. Slonezewski in "Current driven excitation of magnetic multilayers", J. Magn. Magn. Mater. V 159, L1-L7 (1996). P-MTJ technologies that have a high operating speed, low power consumption, excellent endurance, non-volatility, and scalability are highly competitive with existing semiconductor memory technologies such as SRAM, DRAM, and flash.

MRAM and STT-MRAM employ a p-MTJ cell as a switching and storage device. P-MTJs have a general structure wherein an insulating tunnel barrier layer is sandwiched between two magnetic layers. One of the magnetic layers is called the pinned layer and has a magnetization fixed in an out-of-plane direction in the (+z) direction, for example, when the plane of the magnetic layer is formed along the x-axis and y-axis directions. The pinned layer may have a synthetic antiparallel (SyAP) configuration in which an inner magnetic (AP1) layer adjoining the tunnel barrier layer is antiferromagnetically coupled with an outer magnetic (AP2) layer through an intermediate antiferromagnetic coupling (AFC) layer such as Ru. The second magnetic layer called the free layer also has an out-of-plane magnetization with a direction that is free to be either parallel in a (+z) direction (P state) or antiparallel in a (−z) direction (AP state) to that of the AP1 layer. The difference in resistance between the P state ($R_P$) and AP state ($R_{AP}$) can be characterized by the equation ($R_{AP}$−$R_P$)/$R_P$ that is also known as DRR or the magnetoresistive (MR) ratio. It is important for p-MTJ devices to have a large DRR value since this property is directly related to the read margin for the memory bit, or the ease of differentiating between the P state and AP state (0 or 1 bits).

The stability of the magnetizations for the AP1 and AP2 pinned layers is very important for optimum p-MTJ performance in that the antiparallel alignment of the two layers provides the proper spin current for magnetization switching of the free layer during a write process. Ideally, a single domain is formed in both of the AP1 and AP2 layers. However, as a result of the MRAM fabrication process, multiple domains generally form in both pinned layers. Accordingly, spin current during a write process is often weak and insufficient to switch the free layer magnetization.

In order for p-MTJs to be more competitive with competing memory technologies, write performance must be significantly improved while maintaining the other critical device properties such as DRR. Since STT-MRAM is typically embedded in Complementary Metal Oxide Semiconductor (CMOS) devices, the pinned layer and free layer magnetizations must withstand thermal processing up to 400° C. temperatures.

SUMMARY

One objective of the present disclosure is to provide an initialization process to eliminate multiple domains in a pinned layer in a p-MTJ cell such that the current needed to switch free layer magnetization is more uniform and minimized across a plurality of p-MTJ cells in memory devices including MRAM and STT-MRAM, and in other spintronic devices.

A second objective of the present disclosure is to perform the initialization process according to the first objective such that the error rate for switching free layer magnetization is less than 10 ppm.

According to preferred embodiments, these objectives are achieved with a single initialization step wherein a magnetic field is applied to a p-MTJ stack of layers in an in-plane (horizontal) direction, or in a perpendicular-to-plane (vertical) direction. The p-MTJ stack of layers may be in the form of a plurality of p-MTJ cells each having an uppermost capping layer, and a sidewall that stops on a substrate such as a bottom electrode. The p-MTJ stack has at least a pinned layer and free layer (FL), and a tunnel barrier between the FL and pinned layer. In preferred embodiments, the pinned layer has a synthetic antiparallel (SyAP) configuration wherein an inner pinned (AP1) layer adjoins the tunnel barrier layer, and is antiferromagnetically (AF) coupled to an outer pinned (AP2) layer through an intermediate AF coupling (AFC) layer such as Ru.

In a bottom spin valve embodiment, the SyAP pinned layer is below the tunnel barrier and FL. There is also a top spin valve embodiment for the p-MTJ where the SyAP pinned layer is above the tunnel barrier and FL. The present disclosure also encompasses a dual spin valve structure where a first SyAP pinned layer is formed below a first non-magnetic spacer (SP1), a second SyAP pinned layer is formed above a second non-magnetic spacer (SP2), and the FL is between SP1 and SP2. Each of SP1 and SP2 may be a tunnel barrier, or a composite layer with conductive metal pathways in a dielectric matrix.

In a first embodiment where the applied magnetic field for initialization is "in-plane" and parallel to the planes of the p-MTJ layers, the field has sufficient magnitude to align all AP1 and AP2 magnetic domains in a horizontal direction. After the applied field is removed, the tunnel barrier/AP1 interface induces interfacial perpendicular magnetic anisotropy (PMA) such that all AP1 domains have a magnetization in a vertical direction. Because of AF coupling, all domains in the AP2 layer are aligned antiparallel to the AP1 domains. Effectively, each of the AP1 and AP2 layers has a single domain aligned in a vertical direction.

According to a second embodiment, the initialization process is accomplished with an applied magnetic field in the vertical direction. The applied field causes magnetizations in all regions of the AP1 and AP2 layers to be aligned in the direction of the applied field. Once the applied field is removed, AF coupling through the AFC layer causes magnetizations in all regions of the AP1 layer to be aligned antiparallel to the vertical magnetizations in the AP2 layer, and each of the AP1 and AP2 layers effectively has a single domain.

In some embodiments, the initialization step is performed after a final annealing step after the MTJ cell has been patterned. Moreover, the initialization step may occur before, during, or after depositing an encapsulation layer to electrically insulate p-MTJ cells from one another. In other embodiments, the initialization step may be performed a plurality of times, and the final initialization step occurs after the final anneal.

BRIEF DESCRIPTION OF THE DRAWINGS

FIG. 1a and FIG. 1b are cross-sectional views of a p-MTJ wherein a free layer (FL) magnetization is aligned antiparallel and parallel, respectively, to an AP1 pinned layer magnetization in a bottom spin valve configuration according to an embodiment of the present disclosure.

FIG. 2a and FIG. 2b are cross-sectional views of a p-MTJ wherein a FL magnetization is aligned antiparallel and parallel, respectively, to an AP1 pinned layer magnetization in a top spin valve configuration according to an embodiment of the present disclosure.

DETAILED DESCRIPTION

Figure 3A:
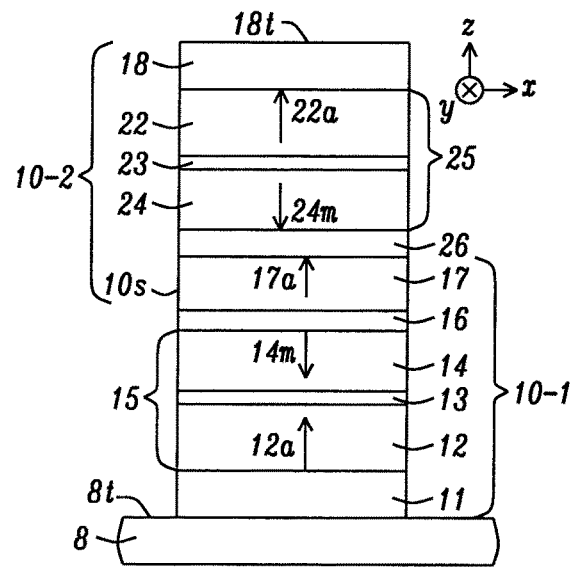
FIG. 3a and FIG. 3b are cross-sectional views of a dual magnetic tunnel junction (DMTJ) wherein a FL magnetization is aligned antiparallel and parallel, respectively, to two AP1 layer magnetizations to give AP/AP and P/P magnetic states according to an embodiment of the present disclosure.

The present disclosure is an initialization step comprising the application of a magnetic field to temporarily set all magnetic domains in the free layer (FL), AP1 pinned layer, and AP2 pinned layer in a first direction that is either in the planes of the p-MTJ layers or orthogonal to the planes of the p-MTJ layers. After the applied field is removed, interfacial perpendicular anisotropy (PMA) that results from metal oxide/ferromagnetic layer interfaces at the AP1/tunnel barrier and tunnel barrier/FL boundaries induces PMA character in the AP1 and FL layers. AF coupling through an AFC layer is responsible for establishing AP2 magnetization that is antiparallel to that of AP1. Although only one p-MTJ cell is depicted in the drawings with cross-sectional views, one skilled in the art appreciates that a plurality of p-MTJ cells is formed in an array of rows and columns in a typical memory device pattern. The planes of the p-MTJ layers are laid out along the x-axis and y-axis directions, and a thickness of each layer is in the z-axis direction. The initialization step described herein is advantageously used to lower the switching current, and lower the switching error rate during a write process in a memory device such as MRAM, STT-MRAM, or in spintronic devices including but not limited to a spin torque oscillator (STO), sensors, and biosensors.

Referring to FIG. 1a, the present disclosure encompasses a p-MTJ 10 having a sidewall 10s that stops on top surface 8t of substrate 8. The p-MTJ has a bottom spin valve configuration wherein an optional seed layer 11, pinned layer 15, non-magnetic spacer 16, FL 17, and capping layer 18 with top surface 18t are sequentially formed on the substrate that in some embodiments is a bottom electrode (BE). The bottom electrode may be a multilayer structure and is typically embedded in a dielectric layer (not shown). Preferably, the pinned layer has a SyAP configuration wherein the inner AP1 layer 14 contacts a bottom surface of the tunnel barrier, the outer AP2 layer 12 adjoins a top surface of the seed layer, or the bottom electrode in other embodiments, and AFC layer 13 is between the AP1 and AP2 layers. The present disclosure also anticipates that at least one additional layer may be included in the aforementioned MTJ stack such as a metal oxide Hk enhancing layer (not shown) between the FL and capping layer that enhances PMA in the FL by introducing an additional FL/metal oxide interface.

In the exemplary embodiment, FL 17 has magnetization 17a, which is aligned in a positive z-axis direction, AP1 layer 14 has magnetization 14m aligned in a negative z-axis direction towards BE top surface 8t, and AP2 layer has magnetization 12a that is antiparallel to 14m. Alternatively, all of the aforementioned magnetizations could be flipped 180° (not shown) to effectively yield the same AP state depicted in FIG. 1a.

A write process that comprises switching current Iw1 may be employed to switch the AP state in p-MTJ 10 in FIG. 1a to the P state in FIG. 1b. Magnetizations 14m, 12a for the AP1 and AP2 layers, respectively, remain unchanged in the p-MTJ. However, FL magnetization 17m is now aligned parallel to 14m in the p-MTJ shown in FIG. 1b. Switching current Iw2 is used to switch the P state of p-MTJ 10 in FIG. 1b to the AP state in FIG. 1a. Those skilled in the art will appreciate that one or more p-MTJ cells in the memory array may be selectively switched from the P state to AP state, or vice versa during a write process.

In all of the embodiments disclosed herein, seed layer 11 may be comprised of one or more of NiCr, Ta, Ru, Ti, TaN, Cu, Mg, or other elements or alloys typically employed to promote a smooth and uniform grain structure in overlying p-MTJ layers. Within SyAP layer 15, the AFC layer 13 is preferably Ru with a thickness of 4, 9, or 14 Angstroms to provide optimal AF coupling between AP1 layer 14 and AP2 layer 12. Optionally, Rh or Ir may serve as the AFC layer. Each of the AP1 and AP2 layers may be comprised of one or more of Co, Fe, and Ni, or an alloy thereof with B. In other embodiments, one or both of the AP1 and AP2 layers may be a laminated stack with inherent PMA such as $(Co/Ni)_n$, $(CoFe/Ni)_n$, $(Co/NiFe)_n$, $(Co/Pt)_n$, $(Co/Pd)_n$, or the like where n is the lamination number. Furthermore, a transitional layer such as CoFeB may be inserted between the uppermost layer in the laminated stack and tunnel barrier layer 16 to provide a CoFeB interface with the tunnel barrier thereby enhancing DRR for MTJ 10.

According to one preferred embodiment, non-magnetic spacer 16 is a tunnel barrier layer having a metal oxide composition that is one of MgO, TiOx, AlTiO, MgZnO, $Al_2O_3$, ZnO, ZrOx, HfOx, or MgTaO. More preferably, MgO is selected as the tunnel barrier layer because MgO provides the highest magnetoresistive ratio (DRR), especially when sandwiched between two CoFeB layers, for example. In other embodiments, the non-magnetic spacer may be a so-called CCP layer wherein conducting current paths made of a metal are formed in a metal oxide matrix.

Free layer 17 may be comprised of the same material as in AP1 layer 14, or in AP2 layer 12. In another embodiment, the FL may have a non-magnetic moment diluting layer such as Ta or Mg that is inserted between two ferromagnetically coupled CoFe or CoFeB layers. Moreover, the FL may have a SyAP configuration such as FL1/Ru/FL2 where FL1 and FL2 are first and second ferromagnetic (FM) layers that are antiferromagnetically coupled.

Capping layer 18 serves as a hard mask during patterning and planarization processes that are employed to form p-MTJ 10, and is typically comprised of one or more of Ta, Ru, TaN, Ti, TiN, and W, or the like. All p-MTJ layers may be deposited with a DC sputter deposition process that generally comprises argon sputter gas and a base pressure between $5\times10^{-8}$ and $5\times10^{-9}$ torr. In related application Ser. No. 15/668,113, we disclosed a process flow that may be used to form a plurality of p-MTJ cells, and an encapsulation layer that electrically insulates adjacent p-MTJ cells.

Figure 9:
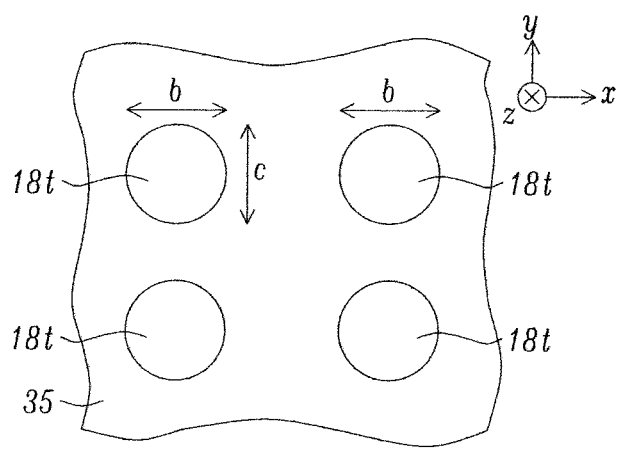
FIG. 9 is a top-down view of an array of p-MTJ cells that are insulated by an encapsulation layer and formed according to an embodiment of the present disclosure.

In the exemplary embodiment depicted in FIG. 9, p-MTJ cells having top surface 18t are formed in a circular shape such that width b in the x-axis direction is essentially equal to length c in the y-axis directions. However, in other embodiments, the p-MTJ cells may have an elliptical or a polygonal shape such that dimension b is unequal to c. Encapsulation layer 35 separates adjacent p-MTJ cells.

In an alternative embodiment shown in FIG. 2a, all of the p-MTJ layers are retained from the first embodiment in FIG. 1a. However, the stacking order yields p-MTJ 19 with sidewall 19s and a top spin valve configuration wherein optional seed layer 11, FL 17, non-magnetic spacer 16, SyAP pinned layer 15, and capping layer 18 are sequentially formed on substrate 8. FL magnetization 17m is antiparallel to AP1 layer magnetization 14a while the AP2 layer has magnetization 12m aligned antiparallel to that of the AP1 layer. Note that all of the aforementioned magnetizations could be flipped 180° (not shown) to effectively provide the same AP state for p-MTJ 19 as shown in FIG. 2a.

During a write process that comprises switching current Iw3, the AP state in FIG. 2a is switched to the P state in FIG. 2b. Magnetizations 14a, 12m for the AP1 and AP2 layers, respectively, remain unchanged in the p-MTJ. However, FL magnetization 17a is now aligned parallel to 14a in the p-MTJ shown in FIG. 2b. Switching current Iw4 may be applied to switch the P state of p-MTJ 10 in FIG. 2b to the AP state in FIG. 2a. Again, one or more p-MTJ cells in the memory array may be selectively switched from the P state to AP state, or vice versa during a write process.

In yet another embodiment of the present disclosure depicted in FIG. 3a, the p-MTJ in FIG. 1a is modified by adding a second non-magnetic spacer 26 on FL 17, followed in order by a second SyAP pinned layer 25, and an uppermost capping layer 18. The second SyAP pinned layer has AP1 layer 24 contacting a top surface of the second non-magnetic spacer, a middle AFC layer 23, and AP2 layer 22 on the middle AFC layer. Accordingly, a first spin valve structure 10-1 comprised of p-MTJ layers 11-17 is formed on substrate 8, and a second spin valve structure 10-2 comprised of FL 17, second spacer 26, SyAP layer 25, and capping layer 18 is formed on structure 10-1. The double stack of layers is often referred to as a dual magnetic tunnel junction (DMTJ) 10-1/10-2. Layers 25, 26 may have the same composition as in layers 15, 16, respectively, that were described previously.

The DMTJ in FIG. 3a is said to have an AP/AP state since FL magnetization 17a is aligned antiparallel to AP1 layer magnetizations 14m in spin valve structure 10-1, and is antiparallel to AP1 layer magnetization 24m in the second spin valve structure 10-2. AP2 layer 22 has magnetization 22a that is antiparallel to that of AP1 layer 24, and AP2 layer 12 has magnetization 12a that is antiparallel to 14m. FL magnetization 17a may be switched to FL magnetization 17m in FIG. 3b by employing switching current Iw5 to produce a P/P state where FL magnetization is now parallel to both AP1 layer magnetizations 14m, and 24m. Similarly, the P/P state in one or more p-MTJ cells may be selectively switched to an AP/AP state by application of switching current Iw6.

Figure 3B:
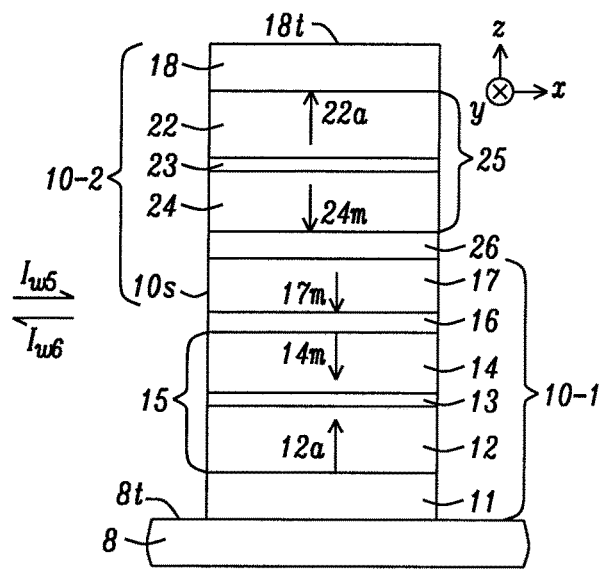
Figure 3C:
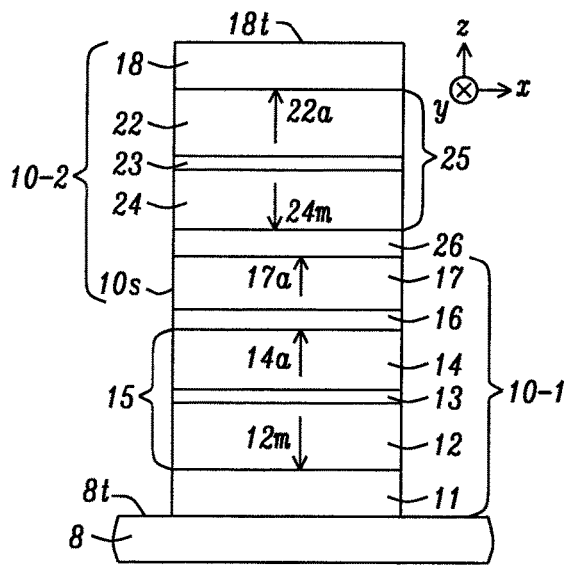
FIG. 3c and FIG. 3d are cross-sectional views of a DMTJ wherein a FL magnetization is aligned parallel to one AP1 layer magnetization and antiparallel to the other AP1 layer magnetization to give P/AP and AP/P magnetic states according to an embodiment of the present disclosure.
Figure 3D:
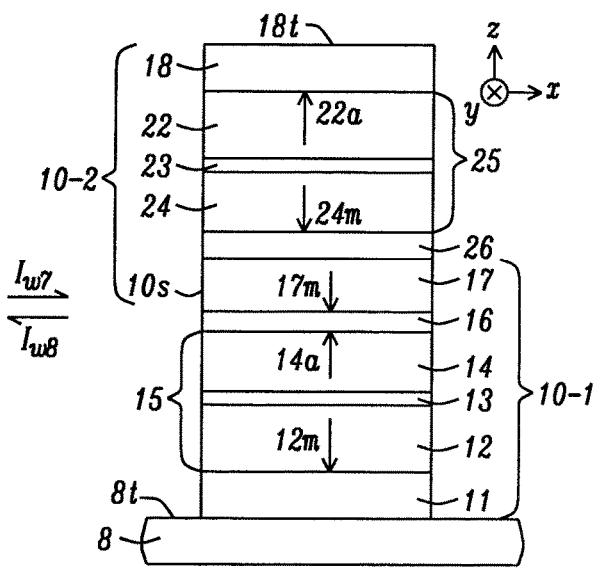

As we described in related patent application HT17-038, the DMTJ configuration in FIGS. 3a-3b is a so-called non-working state for the purpose of lowering critical switching current ($I_C$) since the spin torque placed on the FL from AP1 layer 14 effectively cancels that from AP1 layer 24 when the resistance×area (RA) product for spacer 16 is equal to the RA for spacer 26. On the other hand, the DMTJ configuration depicted in FIGS. 3c-3d shows a so-called working state that substantially lowers ($I_C$) since the spin torque applied to FL 17 when conducting a current (Iw7 or Iw8) through AP1 layer 14 adds to the spin torque on the FL from current through AP1 layer 24. Thus, current Iw7 switches the DMTJ from a P/AP magnetic state in FIG. 3c to an AP magnetic state in FIG. 3d, and current Iw8 switches the AP/P magnetic state to a P/AP magnetic state. We also disclosed embodiments for substantially reducing the RA for first spacer 16 compared with the RA for second spacer 26 in order to generate an acceptable DRR for the DMTJ.

Figure 4:
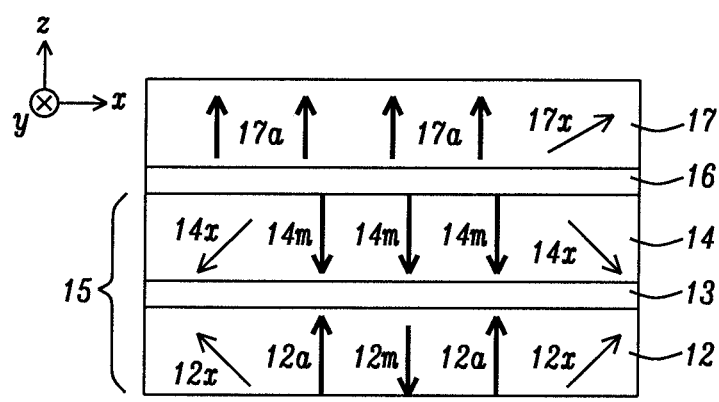
FIG. 4 is a cross-sectional view of a portion of a p-MTJ wherein multiple magnetic domains are formed in the free layer, and in the AP1 and AP2 pinned layers as a result of annealing or stray magnetic fields.

Referring to FIG. 4, it should be understood that p-MTJ cells are typically subjected to annealing processes and stray magnetic fields that cause the AP1 and AP2 layers, and FL to comprise multiple magnetic domains rather than the ideal situation of a single domain aligned in a perpendicular-to-plane direction. Thus, in addition to magnetization 17a in FL 17, there may be multiple FL domains wherein one or more domains has a magnetization 17x comprising both of a horizontal and vertical component such that the net moment is not purely perpendicular-to-plane. It should be understood that magnetization 17a representing an AP state may be replaced by magnetization 17m represented a P state (not shown) for the p-MTJ cell. Likewise, one or more AP1 layer domains tends to have magnetization 14x that has both of a horizontal and vertical component, and one or more AP2 layer domains has magnetization 12x that has both of a horizontal and vertical component.

There may be one or more domains in each of the FL, AP1, and AP2 layers in which a magnetization is aligned opposite to the dominant perpendicular-to-plane direction, or purely in-plane. For example, AP2 layer is shown with at least one domain having magnetization 12m that is opposite to magnetizations 12a. We have found that multiple domains in one or more of the magnetic layers, and especially in the AP1 and AP2 layers, results in abnormal switching behavior. In other words, the "normal" write current necessary to switch a p-MTJ having a single magnetic domain in each of the magnetic layers from an AP state to a P state, or vice versa (FIGS. 1a-1b), is often insufficient to switch the FL when AP1 and AP2 layers have multiple domains as in FIG. 4. In certain p-MTJ cells with a critical dimension of 100 nm or less, the failure (error) rate to switch FL magnetization may be in the range of 30 ppm to 100 ppm, which is unacceptable for MRAM or STT-MRAM to be competitive with other memory technologies.

Figure 5:
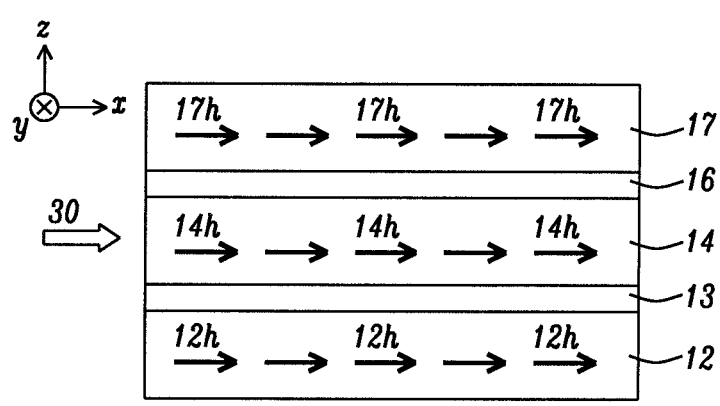
FIG. 5 is a cross-sectional view of the p-MTJ in FIG. 4 during an initialization process comprising application of a horizontal magnetic field according to a first embodiment of the present disclosure.

According to initialization methods described herein, the switching error rate is substantially reduced to less than 10 ppm. A first embodiment of an initialization method of the present disclosure is depicted in FIG. 5 and comprises a step of applying a magnetic field 30 in the plane of the p-MTJ layers. As a result, FL magnetization 17h, AP1 layer magnetization 14h, and AP2 layer magnetization 12h are each in the plane of their respective layers, and orthogonal to the z-axis direction. The in-plane magnetic field has a magnitude from about 1000 Oe to 30000 Oe, and is applied at a temperature proximate to room temperature, and in the absence of an applied electrical current. In some embodiments, the duration of the in-plane magnetic field is substantially less than 1 second. Although the in-plane magnetic field is applied during any portion of the p-MTJ fabrication process, the process is preferably performed after the final annealing process. In some embodiments, the final anneal may be performed after p-MTJ sidewall 10s in FIG. 1a (or 19s in FIG. 2a) is formed. In other embodiments, a final anneal is performed during or after an encapsulation layer is deposited to electrically insulate adjacent p-MTJ cells from one another. The duration of the initialization step may be a plurality of seconds, or as short as a plurality of milliseconds. Furthermore, the initialization process may be repeated one or more times after device fabrication is completed.

Figure 6A:
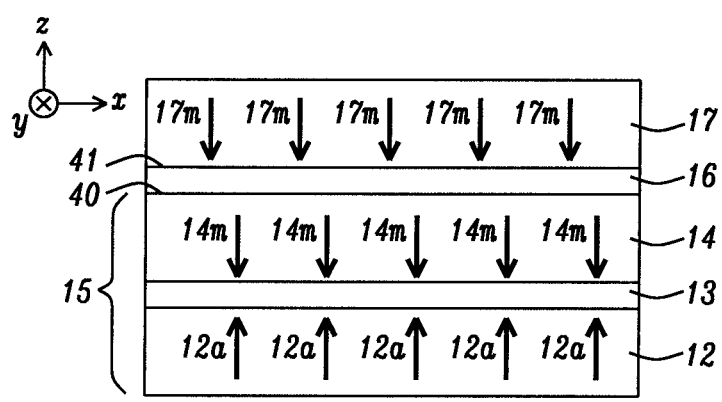
FIGS. 6a-6b are cross-sectional views showing equal probabilities of magnetizations in the p-MTJ layers in FIG. 5 after the applied magnetic field is removed and interfacial PMA generates vertical magnetic domains in the free layer and AP1 layer, and AF coupling is responsible for AP2 magnetization antiparallel to AP1 magnetization according to an embodiment of the present disclosure.
Figure 6B:
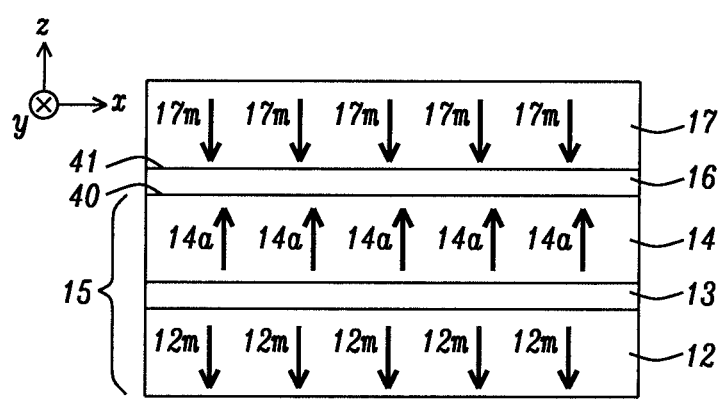

Referring to FIG. 6a, after the applied magnetic field 30 is removed, metal oxide/FM layer interface 40 between non-magnetic spacer 16 and AP1 layer 14 induces a single magnetic domain in the AP1 layer wherein magnetization 14m in all regions of the AP1 layer is perpendicular-to-plane. Likewise, there is a metal oxide/FM layer interface 41 where the non-magnetic spacer adjoins FL 17. Interface 41 induces a single magnetic domain in the FL in which FL magnetization 17m in all FL regions is perpendicular-to-plane and in the same vertical direction as in the AP1 layer to give a P magnetic state for the p-MTJ. Note there is an equal probability that interface 41 induces a single FL domain (AP state) in which FL magnetization is aligned opposite to that shown in FIG. 6a. Because of an appropriate thickness of AFC layer 13, AF coupling between the AP1 layer and AP2 layer 12 is maximized and a single domain occurs in the AP2 layer wherein magnetization 12a in all AP2 regions is aligned in a vertical direction opposite to that in the AP1 layer. There is an equal probability that interface 40 induces AP1 layer magnetization 14a (FIG. 6b), and as a result of AF coupling, AP2 layer magnetization 12m is opposite to 14a.

Although the effect of the initialization method is shown with respect to SyAP layer 15 in a bottom spin valve configuration, a single domain for each of the AP1 and AP2 layers is also formed within SyAP layer 15 in a top spin valve configuration, and within SyAP layers 15, 25 in the dual spin valve structure described earlier with regard to FIGS. 3a-3b, and the DMTJ in FIGS. 3c-3d.

Figure 7:
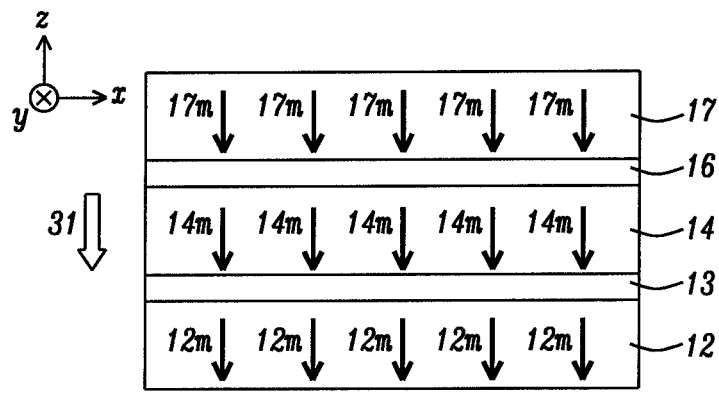
FIG. 7 is a cross-sectional view of the p-MTJ in FIG. 4 during an initialization process comprising application of a vertical magnetic field according to a second embodiment of the present disclosure.

According to a second embodiment, the initialization method of the present disclosure comprises the application of a magnetic field in a perpendicular-to-plane direction to establish a single domain in each of the AP1 layer 14, AP2 layer 12, and FL 17. For example, magnetic field 31 may be applied in a negative z-axis direction that is orthogonal to substrate top surface 8t. As a result, all magnetizations including 17m in the FL, 14m in the AP1 layer, and 12m in the AP2 layer are aligned parallel to the direction of the applied field. In an alternative embodiment (not shown), the applied field may be in a positive z-axis direction such that all magnetizations in the FL, AP1 and AP2 layers are temporarily aligned 180° opposite to 17m, 14m, and 12m, respectively, in FIG. 7.

Figure 8:
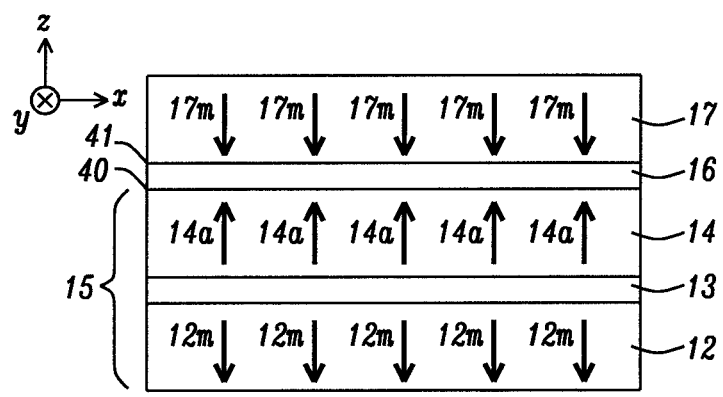
FIG. 8 is a cross-sectional view of showing magnetizations in the p-MTJ layers in FIG. 7 after the vertical magnetic field is removed, and AF coupling is responsible for AP2 magnetization that is antiparallel to AP1 magnetization according to an embodiment of the present disclosure.

Referring to FIG. 8, magnetization 14a in AP1 layer 14 aligns opposite to that of magnetization 12m in AP2 layer 12 after the applied field is removed because of AF coupling through AFC layer 13 in SyAP pinned layer 15, and because of interfacial perpendicular anisotropy induced by the metal oxide/magnetic layer interface 40. According to a preferred embodiment, magnetization 12m is designed to have a greater magnitude than that of magnetization 14a in order to cancel stray fields on the free layer 17. Thus, only magnetization 14m in FIG. 7 reverses direction once the applied field 31 is removed. The AFC layer has an appropriate thickness to maximize AF coupling. For example, a preferred thickness is 4 Angstroms for an AFC layer made of Ru. Thus, magnetizations in each region of the AP1 and AP2 layers are aligned in a perpendicular-to-plane direction such that each of the AP1 and AP2 layers effectively has a single magnetic domain.

In FIG. 9, a top-down view of a memory array comprised of p-MTJ 10 in FIGS. 1a-1b, p-MTJ 19 in FIGS. 2a-2b, or p-MTJ 10-2 in FIGS. 3a-3b is shown. In the exemplary embodiment each of the p-MTJ cells has a circular shape having a width b and length c, and is surrounded by encapsulation layer 35. In other embodiments (not shown) each p-MTJ may have an elliptical or polygonal shape such that b is unequal to c.

Encapsulation layer 35 may be one of $SiO_yN_z$, $AlO_yN_z$, $TiO_yN_z$, $SiC_yN_z$, or MgO, or any combination of the aforementioned materials where y+z>0. In alternative embodiments, the encapsulation layer may be a metal carbide, or another metal oxide, metal nitride, metal oxynitride, or metal carbonitride used in the art. Typically, the encapsulation layer is deposited on the substrate top surface to completely fill spaces between adjacent p-MTJ cells. Thereafter, a planarization method such as a chemical mechanical polish (CMP) process is employed to form an encapsulation layer top surface that is coplanar with p-MTJ top surface 18t.

Following the planarization process to form the p-MTJ array in FIG. 9, a top electrode layer comprised of a plurality of parallel conductive lines (not shown) is formed by a conventional method on the plurality of MTJ cells. Accordingly, each p-MTJ is formed between a top conductive line and a bottom electrode (BE). During a write process with one of the switching currents $I_{w1}$-$I_{w8}$ described previously, the switching current flows from a top conductive line to the BE, or in a reverse direction.

We have demonstrated the benefits of the initialization process of the present disclosure with results from an experiment where a plurality of circular p-MTJ cells where b=c=100 nm (FIG. 9) was fabricated in an array on a 10 Mb MRAM chip. Each p-MTJ was formed with a bottom spin valve configuration represented by p-MTJ 10 in FIGS. 1a-1b. The p-MTJ cells with top surface 18t were patterned with a conventional process flow including patterning a photoresist layer (not shown) on a top surface of a p-MTJ stack of layers, and transferring the pattern of circular islands through the p-MTJ stack with an etching process comprised of a plurality of reactive ion etch steps. The patterned p-MTJ cells were annealed with a temperature of 400° C. for more than 2 hours. Thereafter, encapsulation layer 35 comprised of $SiO_yN_z$ was deposited and a CMP process was performed as described previously. Finally, a top electrode layer (not shown) was formed such that a conductive line contacted each p-MTJ top surface.

Figure 10:
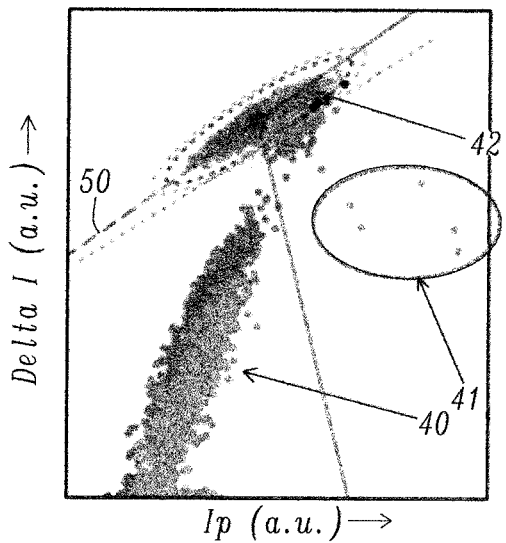
FIG. 10 is a plot of the difference in measured current for parallel (P) and antiparallel (AP) states as a function of the P state switching current for p-MTJ cells that have not been subjected to an initialization process of the present disclosure.

The current ($I_P$) for the P state and current ($I_{AP}$) of the AP state were measured for 5120 p-MTJ normal cells and error bits. Results are shown in FIG. 10 where the difference ($I_P$-$I_{AP}$) is plotted as a function of $I_P$. Ideally, the results from all p-MTJ cells should fall proximate to line 50 and within a region proximate to oval 42. However, in addition to the so-called normal p-MTJs in the aforementioned region, we observed a considerable number of "abnormal" p-MTJs in a region 40 substantially below line 50, and a smaller number of abnormal p-MTJs in region 41 at higher $I_P$ values than p-MTJs in region 40.

We have determined that the root cause of abnormal p-MTJs in region 40 is multiple domains in AP1 and AP2 layers in the SyAP pinned layer. In other words, the switching current for switching the free layer from a P to AP state, or vice versa, in a normal p-MTJ is not sufficient for switching the free layer in an abnormal p-MTJ. Since a key objective of advanced MRAM and STT-MRAM designs is lower power consumption, the higher switching current for abnormal p-MTJs is not acceptable when competing with other technologies such as static random access memory (SRAM). Moreover, higher switching current places more stress on the non-magnetic spacer (i.e. tunnel barrier layer) that leads to shorter device lifetime.

Figure 11:
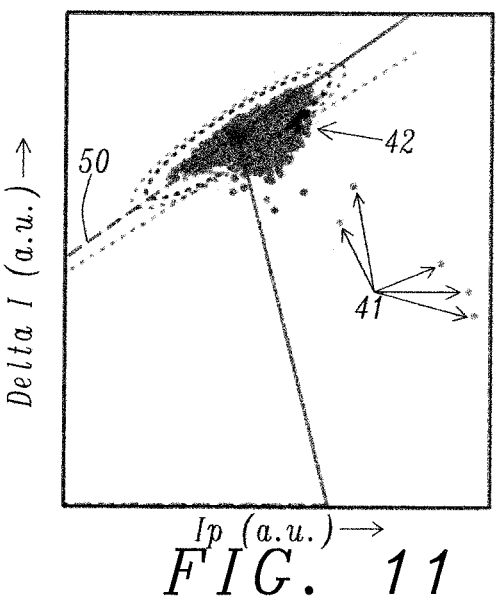
FIG. 11 is a plot of the difference in measured current for parallel (P) and antiparallel (AP) states as a function of the P state switching current for p-MTJ cells that were subjected to an initialization process of the present disclosure.

According to an embodiment of the present disclosure, the same array of p-MTJ cells that produced the results depicted in FIG. 10 were subjected to an initialization method comprised of an applied vertical field of 20000 Oe for hundreds of milliseconds. After removal of the applied field, $I_P$ and $I_{AP}$ were measured again for the 5120 p-MTJ normal cells and error bits. Results are provided in FIG. 11 and show essentially all abnormal p-MTJ cells in region 40 prior to initialization have been corrected to now have $I_{AP}$ and $I_P$ that falls within the range of a normal cell in region 42. Abnormal p-MTJs with data points in region 41 are attributed to a defective tunnel barrier layer, and are not corrected to a normal cell by the application of an applied field according to an embodiment described herein. Thus, uniformity in switching current is significantly improved for a plurality of p-MTJ cells on the MRAM chip by employing an initialization method of the present disclosure.

In summary, we have observed that a typical switching error rate in the range of 30 ppm to 100 ppm for p-MTJ cells that have not been initialized is reduced significantly to less than 10 ppm when the p-MTJ cells are subjected to an initialization process according to an embodiment of the present disclosure. Furthermore, the initialization process may be repeated one or more times after device fabrication to offset the effect of stray fields or temperature excursions that may cause a recurrence of multiple domains in the free layer and pinned layer.

While this disclosure has been particularly shown and described with reference to, the preferred embodiment thereof, it will be understood by those skilled in the art that various changes in form and details may be made without departing from the spirit and scope of this disclosure.

What is claimed is:

1. A method comprising:
   providing a magnetic tunnel junction (MTJ) cell on a substrate, wherein the MTJ cell includes a free layer (FL), a first pinned layer and a second pinned layer, wherein each of the FL, first pinned layer and second pinned layer have a first magnetization domain and a second magnetization domain such that the second magnetization domain is in a different direction than the first magnetization domain;
   applying a magnetic field in a direction such that the first magnetization domain and the second magnetization domain in each of the FL, first pinned layer, and second pinned layer are aligned in the direction of the applied magnetic field; and
   removing the applied magnetic field from the FL, the first pinned layer and the second pinned layer, and
   wherein after the removing of the applied magnetic field the first magnetization domain and the second magnetization domain in the first pinned layer have an equal probability of being aligned in a first direction or a second direction that is different from the first direction;
   wherein after the removing of the applied magnetic field the first magnetization domain and the second magnetization domain in the second pinned layer are both aligned in one of the first direction and the second direction to yield a single magnetic domain in the second pinned layer; and
   wherein after the removing of the applied magnetic field the first magnetization domain and the second magnetization domain in the FL layer are both aligned in one of the first direction and the second direction to yield a single magnetic domain in the Fl.

2. The method of claim 1, wherein after the removing of the applied magnetic field the first magnetization domain and the second magnetization domain in the second pinned layer are both aligned in the first direction and the first magnetization domain and the second magnetization domain in the first pinned layer are both aligned in the second direction.

3. The method of claim 1, wherein the first magnetization domain and the second magnetization domain in the FL layer have an equal probability of being aligned in the first direction or the second direction after the removing of the applied magnetic field.

4. The method of claim 1, wherein the applying of the magnetic field in the direction includes applying the magnetic field in a third direction that is different than the first and second directions.

5. The method of claim 4, wherein the third direction is substantially perpendicular to at least one of the first direction and the second direction.

6. The method of claim 1, wherein all magnetization domains in the FL point in the same direction after the removing of the applied magnetic field,
wherein all magnetization domains in the first pinned layer point in the same direction after the removing of the applied magnetic field, and
wherein all magnetization domains in the second pinned layer point in the same direction after the removing of the applied magnetic field.

7. The method of claim 1, wherein the magnetic field has a magnitude from about 1000 Oe to about 30000 Oe, and is applied at a temperature proximate to room temperature, and in the absence of an applied electrical current.

8. A method comprising:
providing a magnetic tunnel junction (MTJ) cell on a substrate, wherein the MTJ cell includes a free layer (FL), a first pinned layer and a second pinned layer, wherein at least one of the FL, first pinned layer and second pinned layer has a first magnetization domain and a second magnetization domain such that the second magnetization domain is in a different direction than the first magnetization domain;
applying a magnetic field in a direction such that the first magnetization domain and the second magnetization domain are aligned in the direction of the applied magnetic field; and
removing the applied magnetic field to yield a single magnetic domain in each of the FL, the first pinned layer and the second pinned layer, and
wherein the first magnetization domain and the second magnetization domain are both aligned in one of the first direction and the second direction.

9. The method of claim 8, wherein the first magnetization domain and the second magnetization domain are in either the FL or the first pinned layer, and
wherein the first magnetization domain and the second magnetization domain have an equal probability of being aligned in the first direction or the second direction after the removing of the applied magnetic field.

10. The method of claim 8, wherein the applying of the magnetic field in the direction includes applying the magnetic field in one of the first direction and the second direction.

11. The method of claim 8, wherein the applying of the magnetic field in the direction includes applying the magnetic field in a third direction that is different than the first and second directions.

12. The method of claim 8, wherein the MTJ cell further includes:
a seed layer interfacing with the second pinned layer;
an antiferromagnetic layer interfacing with both the first pinned layer and the second pinned layer;
a nonmagnetic spacer layer interfacing with both the first pinned layer and the FL; and
a capping layer interfacing with the FL.

13. The method of claim 8, wherein the MTJ cell further includes:
a seed layer interfacing with the FL;
an antiferromagnetic layer interfacing with both the first pinned layer and the second pinned layer;
a nonmagnetic spacer layer interfacing with both the first pinned layer and the FL; and
a capping layer interfacing with the second pinned layer.

14. The method of claim 8, wherein the MTJ cell further includes a third pinned layer and a fourth pinned layer.

15. The method of claim 8, further comprising forming an encapsulation layer on the MTJ cell to electrically insulate the MTJ cell from another MTJ cell, and
wherein the applying of the magnetic field in the direction occurs either during the forming of the encapsulation layer or after the forming of the encapsulation layer.

16. A method comprising:
providing a magnetic tunnel junction (MTJ) cell on a substrate, wherein the MTJ cell includes a free layer (FL), a first pinned layer, a second pinned layer, and an antiferromagnetic layer coupling the first and second pinned layers, wherein at least one of the FL, the first pinned layer and the second pinned layer includes multiple magnetic domains;
applying a magnetic field in a direction such that all magnetic domains in the FL, the first pinned layer and the second pinned layer are aligned in the direction of the applied magnetic field; and
removing the applied magnetic field to yield a single magnetic domain in each of the FL, the first pinned layer and the second pinned layer, and
wherein the single magnetic domain of the first pinned layer is opposite the single magnetic domain of the second pinned layer.

17. The method of claim 16, wherein the single magnetic domain of the first pinned layer has an equal probability of being in a first direction or a second direction that is different than the first direction after the removing of the applied magnetic field.

18. The method of claim 16, wherein the single magnetic domain of the FL has an equal probability of being in a first direction or a second direction that is different than the first direction after the removing of the applied magnetic field.

19. The method of claim 16, wherein the antiferromagnetic layer includes Ru having a thickness ranging from about 4 Å to about 9 Å.

20. The method of claim 16, wherein the applying the magnetic field in the direction includes applying the magnetic field in the direction a plurality of times.

* * * * *